(12) United States Patent
Tucker et al.

(10) Patent No.: US 10,217,614 B2
(45) Date of Patent: Feb. 26, 2019

(54) CERAMIC GAS DISTRIBUTION PLATE WITH EMBEDDED ELECTRODE

(71) Applicant: LAM RESEARCH CORPORATION, Fremont, CA (US)

(72) Inventors: Jeremy Tucker, Portland, OR (US); Ramkishan Rao Lingampalli, Dublin, CA (US); Tony Kaushal, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 770 days.

(21) Appl. No.: 14/594,423

(22) Filed: Jan. 12, 2015

(65) Prior Publication Data

US 2016/0203952 A1 Jul. 14, 2016

(51) Int. Cl.
| | |
|---|---|
| C04B 35/64 | (2006.01) |
| H01G 11/22 | (2013.01) |
| H01G 9/15 | (2006.01) |
| H01M 8/00 | (2016.01) |
| H01M 4/00 | (2006.01) |
| H01J 37/32 | (2006.01) |
| C23C 16/455 | (2006.01) |
| C23C 16/509 | (2006.01) |

(52) U.S. Cl.
CPC .... H01J 37/3244 (2013.01); C23C 16/45565 (2013.01); C23C 16/5096 (2013.01); H01J 37/3255 (2013.01); H01J 37/32541 (2013.01)

(58) Field of Classification Search
CPC ......... H01L 21/67109; H01L 21/67248; H01L 21/67167; H01L 21/67017; H01J 37/32009; H01J 37/32724; H01J 2237/334; H01J 37/3244; H01J 37/32541; H01J 37/3255; C23C 16/5096; C23C 16/45565; C04B 35/64; H01G 11/22; H01G 9/15; H01M 4/00; H01M 8/00
USPC ........ 118/715; 156/345.33, 345.34; 264/618, 264/603, 430, 297.9
See application file for complete search history.

(56) References Cited

U.S. PATENT DOCUMENTS

| | | | | |
|---|---|---|---|---|
| 4,590,042 A | * | 5/1986 | Drage | H01J 37/3244 156/345.34 |
| 6,197,246 B1 | * | 3/2001 | Niori | H01J 37/32009 118/723 E |
| 2006/0152163 A1 | * | 7/2006 | Miki | F01N 3/0892 315/111.21 |

(Continued)

FOREIGN PATENT DOCUMENTS

JP 2005175508 A * 6/2005

OTHER PUBLICATIONS

Machine Translation for JP 2005175508 A. https://www.j-platpat.inpit.go.jp/web/all/top/BTmTopEnglishPage.*

*Primary Examiner* — Rudy Zervigon

(57) ABSTRACT

A gas distribution plate for a substrate processing system includes a ceramic lower portion of the gas distribution plate including a plurality of ceramic green sheets. A ceramic upper portion of the gas distribution plate includes a plurality of ceramic green sheets. An electrode is printed on at least one of an upper surface of the ceramic lower portion and a lower surface of the ceramic upper portion using metal screen printing. A first plurality of through holes is machined through the ceramic lower portion and the ceramic upper portion of the gas distribution plate prior to sintering.

18 Claims, 6 Drawing Sheets

(56) References Cited

U.S. PATENT DOCUMENTS

| | | |
|---|---|---|
| 2009/0042048 A1 | 2/2009 | Iguchi et al. |
| 2010/0006031 A1* | 1/2010 | Choi ................. C23C 16/45565 118/723 R |
| 2014/0238608 A1 | 8/2014 | Sabri et al. |

* cited by examiner

CERAMIC GAS DISTRIBUTION PLATE WITH EMBEDDED ELECTRODE

FIELD

The present disclosure relates to substrate processing systems, and more particularly to ceramic gas distribution plates with embedded electrodes for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition and/or etching of film on a substrate such as a semiconductor wafer. The substrate processing systems typically include a processing chamber with a substrate support such as a pedestal, an electrostatic chuck, a plate, etc. A substrate such as a semiconductor wafer may be arranged on the substrate support. In chemical vapor deposition (CVD), plasma enhanced CVD (PECVD), atomic layer deposition (ALD) or PEALD processes, a gas mixture including one or more precursors may be introduced into the processing chamber to deposit or etch a film on the substrate. Plasma may be used to activate chemical reactions.

Some processes use a gas distribution device such as a showerhead. The gas distribution device may include a faceplate with a plurality of gas through holes. The gas through holes are arranged in a pattern to provide a desired gas flow pattern. Process gases are supplied to a cavity in the gas distribution device and are disbursed by the through holes of the faceplate over the substrate.

In PECVD and PEALD processes, radio frequency (RF) plasma may be used to activate chemical reactions. For example, a capacitively coupled plasma (CCP) generator may be used to generate plasma in the processing chamber. The plasma is struck in a space between the faceplate of the gas distribution device and the pedestal. In other words, the faceplate of the gas distribution device may act as one electrode of the CCP generator.

Current gas distribution plates are primarily made of aluminum if the plates serve as the electrode. For high temperature applications (greater than 400° C.), aluminum is not used for the gas distribution plate or the electrode due to the lower melting temperature of aluminum. In addition, some gas chemistries that are used in PECVD and PEALD processes are not compatible with aluminum.

Ceramic plates may also be used as gas distribution devices. While addressing the issue of temperature and chemical compatibility, the ceramic plates generally cannot be used in CCP circuits. In order to function as an electrode, a metal element is embedded in the ceramic plate. Embedding a metal electrode in a ceramic body (like a pedestal or chuck) has been accomplished using a hot press (or sintering) manufacturing process. However, the hot press manufacturing process requires a significant amount of machining and grinding to be done after the ceramic faceplate is sintered. The post-sintering grinding is both expensive and time consuming due to the hardness of the ceramic plate. Therefore, it is cost prohibitive to include even a small number of through holes for gas distribution in ceramic plates manufactured using the hot press manufacturing process.

The hot press manufacturing process also places significant limitations on the dimensional accuracy of embedding the metal electrode in the ceramic plate. In other words, the precision in setting the horizontal and vertical location and/or the planarity of the electrode is limited due to the hot press manufacturing process. This limitation makes it difficult to accurately grind through holes while avoiding the metal electrode. These issues make the hot press manufacturing process economically unfeasible when producing ceramic gas distribution plates with embedded electrodes.

SUMMARY

A method for manufacturing a gas distribution plate for a substrate processing system includes creating a ceramic lower portion of the gas distribution plate, wherein the ceramic lower portion includes a plurality of ceramic green sheets; creating a ceramic upper portion of the gas distribution plate, wherein the ceramic upper portion includes a plurality of ceramic green sheets; printing an electrode on at least one of an upper surface of the ceramic lower portion and a lower surface of the ceramic upper portion using metal screen printing process; machining a first plurality of through holes through the ceramic lower portion and the ceramic upper portion of the gas distribution plate; and sintering the ceramic upper portion and the ceramic lower portion to form the gas distribution plate.

In other features, the electrode is printed with holes aligned with the first plurality of through holes in the ceramic lower portion and the ceramic upper portion. The electrode is made of a material having a coefficient of thermal expansion that matches a coefficient of thermal expansion of the ceramic upper portion and the ceramic lower portion. The electrode is made of molybdenum. The electrode is made of tungsten.

In other features, the ceramic green sheets are made of a material selected from a group consisting of aluminum nitride (AlN), aluminum oxide ($Al_2O_3$), silicon nitride ($Si_3N_4$), yttrium oxide ($Y_2O_3$), zirconium oxide ($ZrO_2$) and composites made therefrom.

In other features, the method further includes, prior to the sintering, machining a second plurality of through holes through the ceramic lower portion and the ceramic upper portion of the gas distribution plate. The second plurality of through holes is arranged radially outside of the first plurality of through holes. The second plurality of through holes has a different shape than the first plurality of through holes. The second plurality of through holes is slot-shaped and the first plurality of through holes is circular.

In other features, the method includes passing gas through the first plurality of through holes of the gas distribution plate to a substrate side of the gas distribution plate; and exhausting gas from the substrate side of the gas distribution plate using the second plurality of through holes.

In other features, the first plurality of through holes has a diameter that is less than 3 plasma sheath thicknesses. The second plurality of through holes has a width that is less than 3 plasma sheath thicknesses and a length that is 2 to 10 times the width.

A gas distribution plate for a substrate processing system includes a ceramic lower portion of the gas distribution plate including a plurality of ceramic green sheets. A ceramic upper portion of the gas distribution plate includes a plurality of ceramic green sheets. An electrode is printed on at least one of an upper surface of the ceramic lower portion and a lower surface of the ceramic upper portion using metal screen printing. A first plurality of through holes is machined through the ceramic lower portion and the ceramic upper portion of the gas distribution plate prior to sintering.

In other features, the electrode includes holes aligned with the first plurality of through holes in the ceramic lower portion and the ceramic upper portion. The electrode is made of a material having a coefficient of thermal expansion that matches a coefficient of thermal expansion of the ceramic upper portion and the ceramic lower portion. The electrode is made of molybdenum. The electrode is made of tungsten.

In other features, the ceramic green sheets are made of a material selected from a group consisting of aluminum nitride (AlN), aluminum oxide ($Al_2O_3$), silicon nitride ($Si_3N_4$), yttrium oxide ($Y_2O_3$), zirconium oxide ($ZrO_2$) and composites made therefrom. A second plurality of through holes is machined through the ceramic lower portion and the ceramic upper portion of the gas distribution plate prior to sintering. The second plurality of through holes is arranged radially outside of the first plurality of through holes. The second plurality of through holes has a different shape than the first plurality of through holes. The second plurality of through holes is slot-shaped and the first plurality of through holes is circular.

In other features, the first plurality of through holes has a diameter that is less than 3 plasma sheath thicknesses. The second plurality of through holes has a width that is less than 3 plasma sheath thicknesses and a length that is 2 to 10 times the width.

A substrate processing system comprises the gas distribution plate, a processing chamber, a plasma generator and a pedestal. The processing chamber operates at a temperature greater than 400° C.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A gas distribution plate according to the present disclosure distributes gas and serves as an electrode in a capacitively coupled plasma (CCP) process. The gas distribution plate includes a ceramic body. In some examples, aluminum nitride (AlN), aluminum oxide ($Al_2O_3$), silicon nitride ($Si_3N_4$), yttrium oxide ($Y_2O_3$), zirconium oxide ($ZrO_2$) and composites made therefrom may be used. For example only, zirconium aluminate or yttrium aluminate may be used to provide high corrosion resistance to fluorine. The gas distribution plate includes through holes for gas distribution and an embedded metal electrode. In some examples, metal vias are arranged around the outer diameter of the plate to conduct radio frequency (RF) power to the embedded metal electrode.

In some examples, the electrode and vias are made of a metal with a coefficient of thermal expansion (CTE) that is closely matched to the CTE of the ceramic. In some examples, molybdenum, tungsten or another suitable metal may be used. In PECVD or PEALD reactors, the gas distribution plate serves as the RF powered electrode to produce a capacitively coupled plasma. In some examples, the reactant gases for the plasma can be introduced through gas through holes and exhausted through slotted holes in the gas distribution plate.

The use of ceramic allows the plate to be used in high temperature environments. The gas distribution plate addresses the problem of high temperature PECVD or PEALD reactors that require the gas distribution plate to serve as the powered electrode in a CCP circuit. Ceramic also makes the gas distribution plate resistant to most gas chemistries and plasmas. In some examples, the gas distribution plate is used in a CCP reactor operating at temperatures between 400° C. and 1100° C. and/or using corrosive gas chemistries. Alternatively, the gas distribution plate can be used in any PECVD CCP reactor as an electrode or in any CVD reactor as a gas distribution plate.

Figure 1:
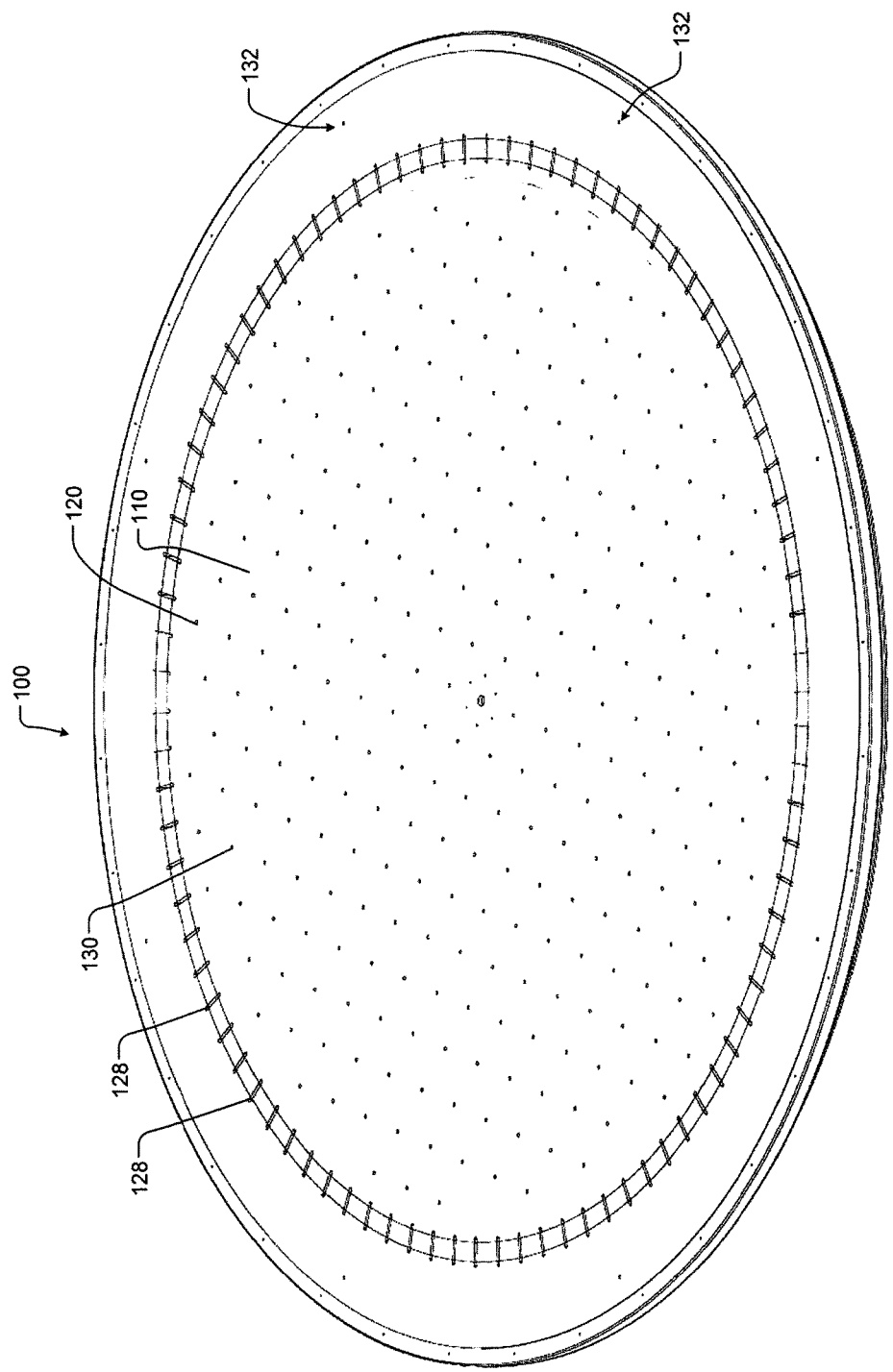
FIG. 1 is a top perspective view of an example of a ceramic gas distribution plate with an embedded electrode according to the present disclosure.

Referring now to FIGS. 1-4, a ceramic gas distribution plate 100 with an embedded electrode is shown. In FIG. 1, the ceramic gas distribution plate 100 includes a top surface 110 with a first plurality of through holes 120 arranged in a radially inner portion of the ceramic gas distribution plate 100. In some examples, the first plurality of through holes 120 are circular and have a diameter that is less than 2 or 3 plasma sheath thicknesses.

The ceramic gas distribution plate 100 further includes a second plurality of through holes 128 arranged radially outside of the first plurality of through holes 120. In the example in FIG. 1, the second plurality of through holes 128 are generally slot-shaped. In some examples, the slots have a first size dimension (length in a radial direction in the example in FIG. 1) that is larger than a second size dimension (width in a circumferential direction in the example in FIG. 1). In some examples, the second size dimension of the slot is less than 2 or 3 plasma sheath thicknesses and the first size dimension of the slot is greater than the second size dimension. In some examples, the first size dimension of the slot is at least 2-10 times greater than the second size dimension depending upon a desired conduction for the faceplate.

While the first plurality of through holes 120 shown in FIG. 1 is circular and the second plurality of through holes 128 in FIG. 1 is slot-shaped, the first plurality of through holes 120 and the second plurality of through holes 128 may have other shapes. Additional through holes 132 may be arranged adjacent to a radially outer edge of the ceramic gas distribution plate 100.

Figure 2:
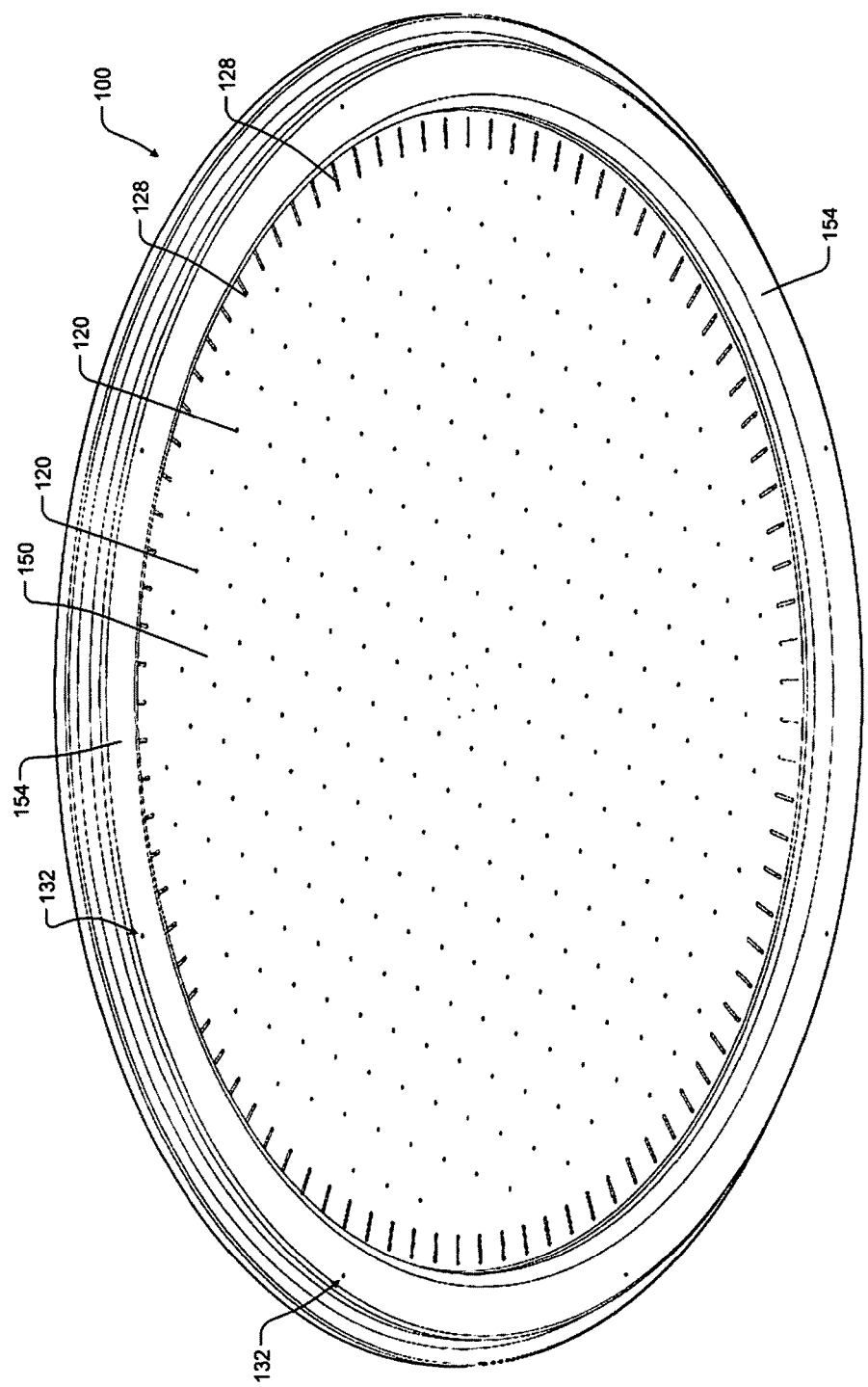
FIG. 2 is a bottom perspective view of an example of a ceramic gas distribution plate with an embedded electrode according to the present disclosure.

In FIG. 2, a bottom surface 150 of the ceramic gas distribution plate 100 is shown. The bottom surface 150 includes an axially-projecting annular surface 154 arranged adjacent to a radially outer edge of the ceramic gas distribution plate 100. The axially-projecting annular surface 154 projects in a downward direction towards the substrate when arranged in a substrate processing system.

Figure 3:
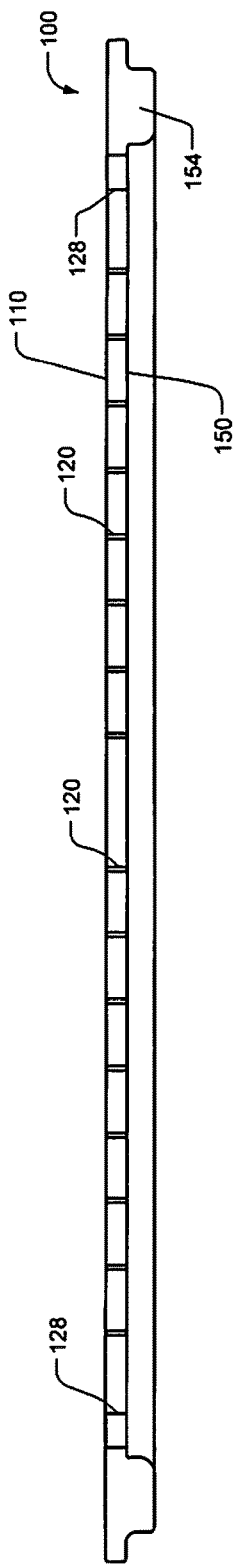
FIG. 3 is a side cross-sectional view of an example of a ceramic gas distribution plate with an embedded electrode according to the present disclosure.
Figure 4:
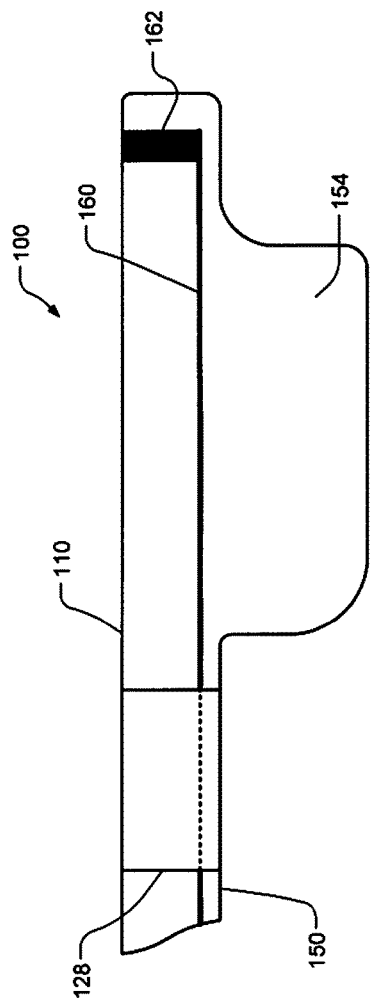
FIG. 4 is an enlarged side cross-sectional view of an example of a ceramic gas distribution plate with an embedded electrode according to the present disclosure.

In FIGS. 3 and 4, additional details of the ceramic gas distribution plate 100 are shown. In FIG. 3, the first plurality of through holes 120 passes through the ceramic gas distribution plate 100 and allows gas to pass through the ceramic gas distribution plate 100 into a region below the ceramic gas distribution plate 100. Likewise, the second plurality of through holes 128 passes through the ceramic gas distribution plate 100 and allows gas to return through the ceramic gas distribution plate 100.

In FIG. 4, an electrode 160 is embedded in the ceramic gas distribution plate 100 in a plane generally parallel to the substrate and generally perpendicular to the direction that gas flows into the through holes 120, 128 and 132. The electrode 160 may be connected to vias 162 that extend from the electrode 160 to the top surface of the gas distribution plate 100 adjacent to the radially outer edge of the ceramic gas distribution plate 100 to provide an electrical connection to the electrode 160.

Figure 5:
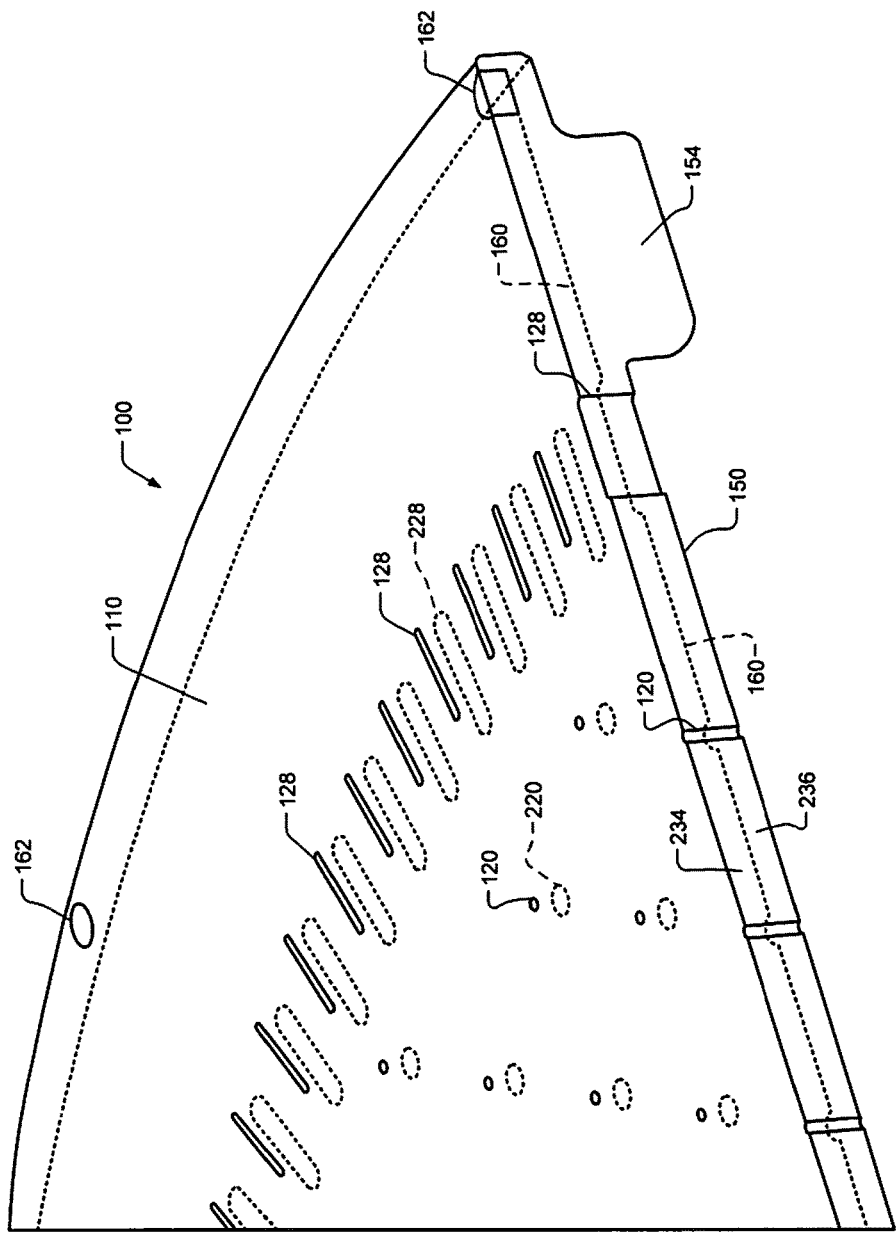
FIG. 5 is a partial top perspective and cross-sectional view of an example of a ceramic gas distribution plate with an embedded electrode according to the present disclosure.
Figure 6:
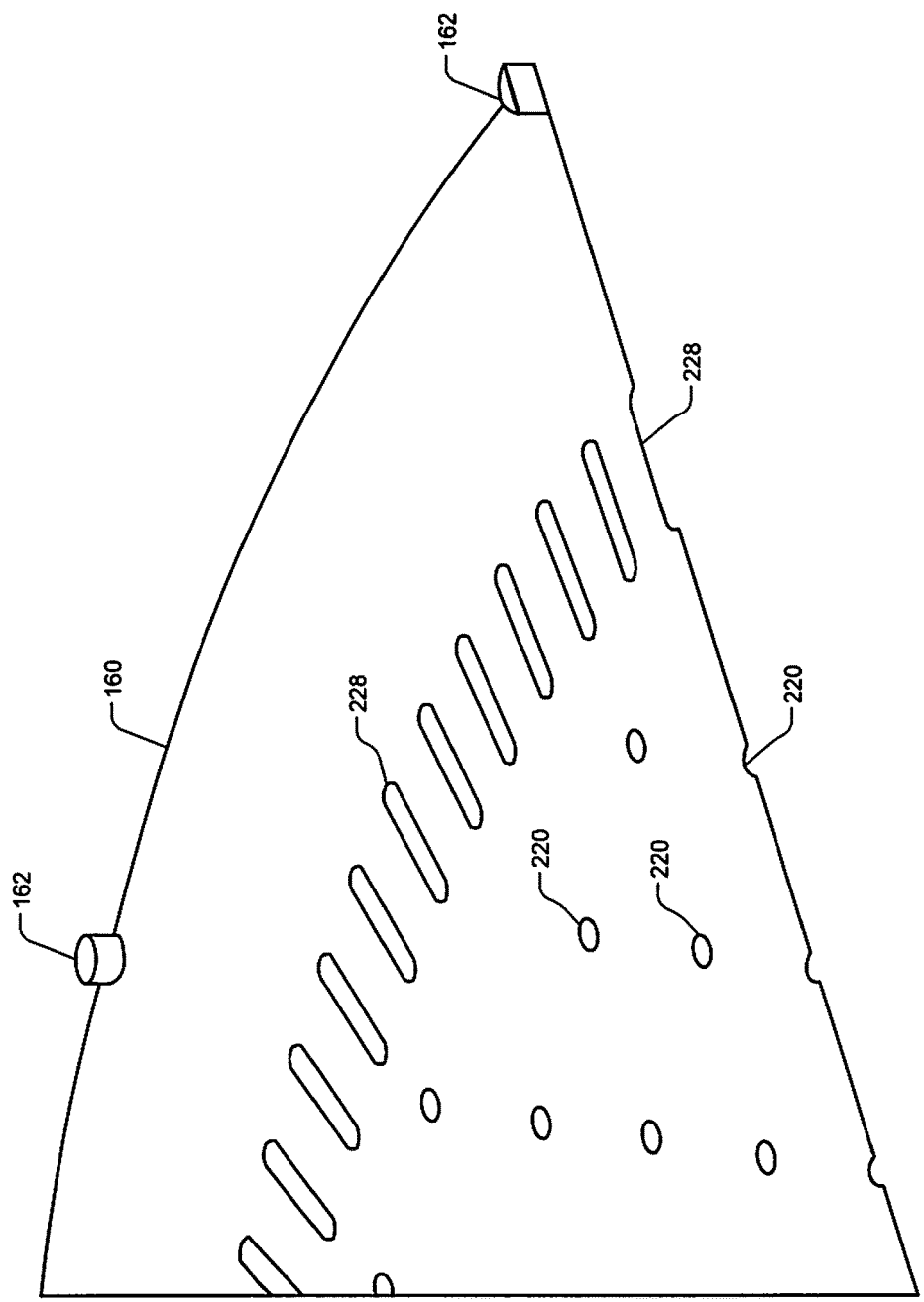
FIG. 6 is a partial top perspective and cross-sectional view of an example of a an embedded electrode according to the present disclosure.

Referring now to FIGS. 5 and 6, additional details of the electrode 160 are shown. The electrode 160 includes holes 220 and 228 that align with the through holes 120 and 128. The holes 220 and 228 in the electrode 160 are larger than the corresponding through holes 120 and 128 to provide clearance and to prevent contact with or exposure of the electrode 160. Similar holes (not shown) in the electrode 160 may be provided for the through holes 132. The electrode 160 is sandwiched between upper and lower portions 234 and 236 of the ceramic gas distribution plate 100 as will be described further below.

In some examples, the ceramic gas distribution plate 100 is produced using a green body (sheet) ceramic manufacturing process combined with a metal screen printing process. In other words, the lower portion 236 of the ceramic gas distribution plate 100 is made using one or more green sheets. Then, the electrode 160 is screen printed on an upper surface of the lower portion 236. Finally, the upper portion 234 of the ceramic gas distribution plate 100 is arranged over the electrode 160. As can be appreciated, the electrode 160 can also be screen printed onto a lower surface of the upper portion 234 and then the lower portion can be arranged over the electrode 160.

This approach allows the electrode 160 to be accurately printed onto a green body and placed between one or more ceramic green sheets to produce a ceramic plate of a desired thickness.

A gas distribution plate assembly including the upper portion 234, the lower portion 236 and the electrode 160 are machined in the green state prior to sintering. This allows the desired number of through holes or slots required for uniform gas distribution to be machined at a fraction of the time and cost of machining a hot press manufactured part. The accuracy of the features machined in the green state is retained sufficiently that post-sintering machining is limited to a fraction of the overall machining of the ceramic gas distribution plate 100.

Figure 7:
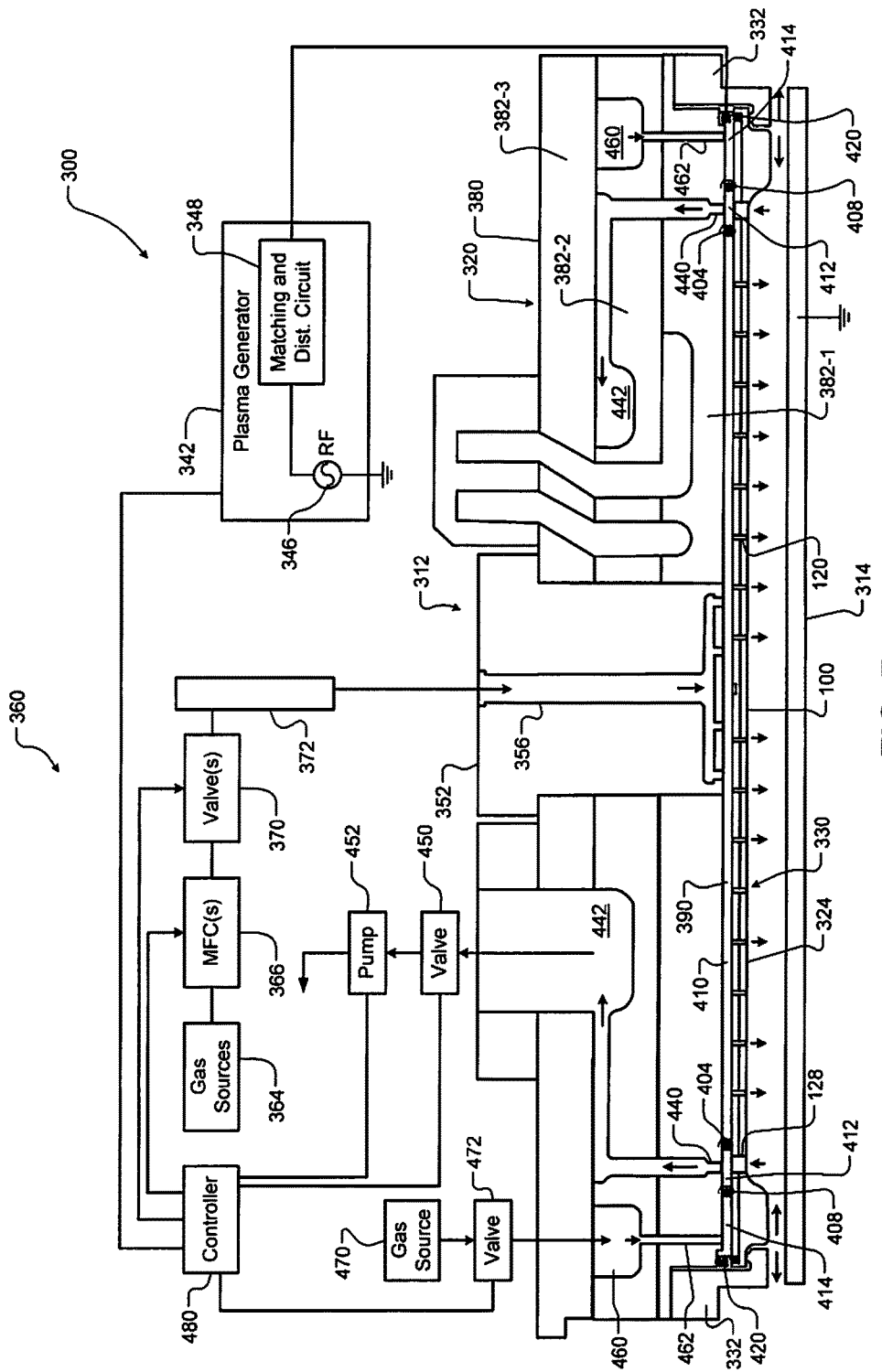
FIG. 7 is a functional block diagram of an example of a substrate processing system including a ceramic gas distribution plate with an embedded electrode according to the present disclosure.

Referring now to FIG. 7, an example of a processing chamber 300 is shown. The processing chamber 300 includes a gas distribution device 312 arranged adjacent to a substrate support 314. In some examples, the processing chamber 300 may be arranged inside of another processing chamber. A pedestal may be used to lift the substrate support 314 into position to create a micro process volume. The gas distribution device 312 includes the gas distribution plate 100.

A plasma generator 342 includes an RF source 346 and a matching and distribution circuit 348. The plasma generator 342 provides RF power to the electrode of the gas distribution plate 100 to create plasma.

A gas delivery system 360 may be provided to supply one or more process gases, purge gases, etc. to the processing chamber 300. The gas delivery system 360 may include one or more gas sources 364 that are in fluid communication with corresponding mass flow controllers (MFCs) 366, valves 370 and a manifold 372. The manifold 372 is in fluid communication with the first cavity 356. The gas delivery system 360 meters delivery of a gas mixture including one or more process gases to the manifold 372. The process gases may be mixed in the manifold 372 prior to delivery to the processing chamber 300.

The gas distribution plate 100 may rest on an isolator 332. In some examples, the isolator 332 may be made of $Al_2O_3$ or another suitable material. An upper portion 320 may include a center section 352 that defines a first cavity 356. In some examples, the center section 352 is made of $Al_2O_3$ or another suitable material. The upper portion 320 also includes a radially outer section 380 arranged around the center section 352. The radially outer section 380 may include one or more layers 382-1, 382-2, . . . , and 382-N (collectively layers 382), where N is an integer greater than zero. In the example in FIG. 7, the radially outer section 380 includes N=3 layers 382 that define exhaust and gas curtain cavities, although additional or fewer layers may be used.

The center section 352 and the radially outer section 380 are arranged in a spaced relationship relative to the gas distribution plate 100 to define a second cavity 390.

Process gas flows from the gas delivery system 360 through the first cavity 356 to the second cavity 390. The process gases in the second cavity 390 flow through the first plurality of through holes 120 in the gas distribution plate 100 to distribute the process gas uniformly across the substrate arranged on the substrate support 314. In some examples, the substrate support 314 is heated.

In some examples, the gas distribution plate 100 included the second plurality of through holes 128 to provide an exhaust path for the process gas flow back though the gas distribution plate 100 after the process gas is exposed to the substrate. The second plurality of through holes 128 may be arranged around an outer periphery of the gas distribution plate 100.

One or more annular seals may be provided to separate different portions of the second cavity. In some examples, the annular seals are nickel plated annular seals. For example, first and second annular seals 404 and 408, respectively, may be provided to define boundaries between a supply portion 410 of the second cavity 390, an exhaust portion 412 of the second cavity 390, and a gas curtain portion 414, respectively.

In this example, the first annular seal 404 defines the boundary between the supply portion 410 and the exhaust portion 412. A third annular seal 420 (in conjunction with the second annular seal 408) may be provided to define the gas curtain portion 414 of the second cavity 390. In this example, the second annular seal 408 defines the boundary between the exhaust portion 412 and the gas curtain portion 414 of the second cavity 390. The first, second and third annular seals 404, 408, and 420, respectively, may include annular metal seals.

The radially outer section 380 further defines exhaust inlets 440 and exhaust cavities 442 that receive exhaust gas from the exhaust portion 412 of the second cavity 390. A valve 450 and a pump 452 may be used to evacuate the exhaust portion 412. The radially outer section 380 also defines a gas curtain cavity 460 and a gas curtain outlet 462 that supply purge gas to the gas curtain portion 414 of the second cavity 390. A gas source 470 and a valve 472 may be used to control purge gas supplied to the gas curtain portion 414.

The third annular seal 420 may also provide an electrical connection from the plasma generator 342 to the electrode 160 embedded in the gas distribution plate 100, although other methods for connecting the electrode 160 may be used.

A controller 480 may be used to monitor system parameters using sensors and to control the gas delivery system 360, the plasma generator 342 and other components of the process.

The particular geometry of the gas holes in the gas distribution device may be selected for specific process conditions. For a given process condition, the minimum and maximum diameter required to sustain HCD can be estimated analytically or determined empirically. According to the present disclosure, the holes in the faceplate of the gas distribution device use a combined approach rather than (i) making the gas holes smaller than the minimum diameter that can sustain HCD, or (ii) larger than the maximum diameter that can sustain HCD.

Some of the holes in the faceplate of the gas distribution device according to the present disclosure are slot-shaped and have a first size dimension (such as a width) that is less than the minimum size dimension that will sustain HCD and a second size dimension (such as a length) that is larger than the minimum size dimension that will sustain HCD. In other words, one of the size dimensions is used to prevent HCD and the other one of the size dimensions is increased to reduce the number of holes that would otherwise be needed if circular holes were used.

In some examples, the first size dimension of the slot is less than 2 or 3 plasma sheath thicknesses. In some examples, the second size dimension of the slot is greater than the first size dimension. In some examples, the second size dimension of the slot is 2-10 times greater than the first size dimension. For example only, the slots may have a first size dimension of 0.04 inches and a second size dimension of 0.4 inches.

The flow conduction through a circular hole can be roughly approximated by $$\frac{\pi}{256}d^4,$$

where d is a diameter of the circular hole. In contrast, the flow conduction of a narrow slot with laminar flow and the same thickness can be roughly approximated by $$\frac{1}{24}ab^3,$$

where a is the length and b is the width. If the second size dimension is 2 times the first size dimension, the conductance will be about 2.4 times that of two holes with diameters of the first dimension. As can be seen from the foregoing, doubling the second size dimension of one slot (relative to the circular hole) significantly improves the conductance relative to two circular holes with the same original width. Additional improvement can be seen with greater increases in the second size dimension relative to the first size dimension.

The geometry of at least some of the holes in the faceplate according to the present disclosure have a slotted shape such that the plasma sheath cannot enter due to the proximity of the opposing walls. The width and length of the slots may be determined based on the pressure, reactant species, and plasma power for a particular process to be used. In some examples, the slots are arranged with the length of slot aligned with radial lines of the faceplate. In other examples, the slots are arranged with the length of slots transverse to the radial lines or at other angles relative to the radial lines.

In order for a faceplate to produce a similar flow conduction as faceplates with the slotted-shaped holes and without HCD as described herein, the faceplate would require a very large number of circular holes (each with a diameter less than or equal to 2 or 3 plasma sheath thicknesses). The large number of holes typically requires costly machining, which is expensive. Because fewer slots are required to produce the same results as a larger number of circular holes, the faceplate is less expensive to manufacture and can also be made from a wider variety of materials.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for manufacturing a gas distribution plate for a substrate processing system, comprising:
   (a) creating a ceramic lower portion of the gas distribution plate, wherein the ceramic lower portion includes a plurality of ceramic green sheets;
   (b) creating a ceramic upper portion of the gas distribution plate, wherein the ceramic upper portion includes a plurality of ceramic green sheets;
   (c) while the ceramic lower portion and the ceramic upper portion are in a green state, printing an electrode on at least one of an upper surface of the ceramic lower portion and a lower surface of the ceramic upper portion using metal screen printing process;
   (d) while the ceramic lower portion and the ceramic upper portion are in the green state, sandwiching the electrode between the ceramic lower portion and the ceramic upper portion after (c);
   (e) while the ceramic lower portion and the ceramic upper portion are in the green state, machining a first plurality of through holes through the ceramic lower portion, the ceramic upper portion, and the electrode after (d),
   wherein the first plurality of through holes are configured to pass gas to a substrate side of the gas distribution plate;
   (f) machining a second plurality of through holes through the ceramic lower portion, the ceramic upper portion, and the electrode,
   wherein the second plurality of through holes is arranged radially outside of the first plurality of through holes,
   wherein the second plurality of through holes is configured to exhaust gas from the substrate side of the gas distribution plate, and
   wherein the through holes of the second plurality of through holes have a different shape than the through holes of the first plurality of through holes; and
   (g) sintering the ceramic upper portion and the ceramic lower portion to form the gas distribution plate after (e).

2. The method of claim 1, wherein:
   (c) includes printing the electrode with holes; and
   (d) includes machining the first plurality of through holes and the second plurality of through holes through the ceramic upper portion, the ceramic lower portion, and the holes in the electrode.

3. The method of claim 1, wherein the electrode is made of a material having a coefficient of thermal expansion that matches a coefficient of thermal expansion of the ceramic upper portion and the ceramic lower portion.

4. The method of claim 1, wherein the electrode is made of molybdenum.

5. The method of claim 1, wherein the electrode is made of tungsten.

6. The method of claim 1, wherein the ceramic green sheets are made of a material selected from a group consisting of aluminum nitride (AlN), aluminum oxide ($Al_2O_3$), silicon nitride ($Si_3N_4$), yttrium oxide ($Y_2O_3$), zirconium oxide ($ZrO_2$) and composites thereof.

7. The method of claim 1, wherein the through holes of the second plurality of through holes are slot-shaped and the through holes of the first plurality of through holes are circular.

8. The method of claim 7, further comprising:
passing gas through the first plurality of through holes of the gas distribution plate to a substrate side of the gas distribution plate; and
exhausting gas from the substrate side of the gas distribution plate using the second plurality of through holes.

9. The method of claim 7, wherein the through holes of the first plurality of through holes have a diameter that is less than 3 plasma sheath thicknesses and wherein the through holes of the second plurality of through holes have a width that is less than 3 plasma sheath thicknesses and a length that is 2 to 10 times the width.

10. A gas distribution plate for a substrate processing system, comprising:
a ceramic lower portion of the gas distribution plate including a plurality of ceramic green sheets;
a ceramic upper portion of the gas distribution plate including a plurality of ceramic green sheets;
an electrode that is:
printed on at least one of an upper surface of the ceramic lower portion and a lower surface of the ceramic upper portion using metal screen printing while the ceramic lower portion and the ceramic upper portion are in a green state; and
sandwiched between the ceramic lower portion and the ceramic upper portion while the ceramic lower portion and the ceramic upper portion are in the green state;
a first plurality of through holes machined through the ceramic lower portion, the ceramic upper portion, and the electrode while the ceramic lower portion and the ceramic upper portion are in the green state prior to sintering
wherein the first plurality of through holes being configured to pass gas to a substrate side of the gas distribution plate; and
a second plurality of through holes through the ceramic lower portion, the ceramic upper portion, and the electrode while the ceramic lower portion and the ceramic upper portion are in the green state prior to sintering,
wherein the second plurality of through holes is arranged radially outside of the first plurality of through holes,
wherein the second plurality of through holes is configured to exhaust gas from the substrate side of the gas distribution plate, and
wherein the through holes of the second plurality of through holes have a different shape than the through holes of the first plurality of through holes.

11. The gas distribution plate of claim 10, wherein:
the electrode includes holes; and
the first plurality of through holes and the second plurality of through holes are machined through the ceramic lower portion, the ceramic upper portion, and the holes in the electrode while the ceramic lower portion and the ceramic upper portion are in the green state.

12. The gas distribution plate of claim 10, wherein the electrode is made of a material having a coefficient of thermal expansion that matches a coefficient of thermal expansion of the ceramic upper portion and the ceramic lower portion.

13. The gas distribution plate of claim 10, wherein the electrode is made of molybdenum.

14. The gas distribution plate of claim 10, wherein the electrode is made of tungsten.

15. The gas distribution plate of claim 10, wherein the ceramic green sheets are made of a material selected from a group consisting of aluminum nitride (AlN), aluminum oxide (Al2O3), silicon nitride (Si3N4), yttrium oxide (Y2O3), zirconium oxide (ZrO2) and composites thereof.

16. The gas distribution plate of claim 10, wherein the through holes of the second plurality of through holes are slot-shaped and the through holes of the first plurality of through holes are circular.

17. The gas distribution plate of claim 10, wherein:
the through holes of the first plurality of through holes have a diameter that is less than 3 plasma sheath thicknesses; and
the through holes of the second plurality of through holes have a width that is less than 3 plasma sheath thicknesses and a length that is 2 to 10 times the width.

18. A substrate processing system comprising:
the gas distribution plate of claim 10;
a processing chamber;
a plasma generator; and
a pedestal, wherein the processing chamber operates at a temperature greater than 400° C.

* * * * *